(12) United States Patent
Takakuwa et al.

(10) Patent No.: US 6,575,038 B1
(45) Date of Patent: Jun. 10, 2003

(54) PRESSURE SENSOR AND METHOD FOR ASSEMBLING THE SAME

(75) Inventors: Masaki Takakuwa, Toyohashi (JP); Michitaka Hayashi, Nagoya (JP); Hironobu Baba, Obu (JP); Masahito Imai, Chita (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/550,017

(22) Filed: Apr. 14, 2000

(30) Foreign Application Priority Data

Apr. 26, 1999 (JP) ............................. 11-118563
Feb. 17, 2000 (JP) ....................... 2000-045143

(51) Int. Cl.[7] ............................................. G01L 7/00
(52) U.S. Cl. .................................... 73/706; 73/756
(58) Field of Search ..................... 73/706, 715, 700, 73/725–727, 719–721, 493, 756; 29/855

(56) References Cited

U.S. PATENT DOCUMENTS 5,691,479 A * 11/1997 Krisch et al. ................ 73/756
5,900,554 A * 5/1999 Baba et al. ................... 73/725
5,987,996 A * 11/1999 Kim et al. .................... 73/756
6,267,010 B1 * 7/2001 Hatanaka et al. ............ 73/756

FOREIGN PATENT DOCUMENTS

JP 7-151625 6/1995
JP 10-115536 6/1998

* cited by examiner

Primary Examiner—Max Noori
(74) Attorney, Agent, or Firm—Posz & Bethards, PLC

(57) ABSTRACT

A pressure sensor has a sensor element portion for detecting pressure, and a pressure conduction portion connectable to a detected member and defining therein a conduction passage for conducting pressure from the detected member to the sensor element portion. A protective cap is detachably attached to the pressure conduction portion to cover a sealed portion where the pressure conduction portion is to be sealed to the detected member until before the pressure sensor is connected to the detected member. The protective cap has an opening portion through which the conduction passage communicates with an outside thereof. Accordingly, pressure characteristics can be checked without detaching the protective cap from the pressure conduction portion.

19 Claims, 8 Drawing Sheets

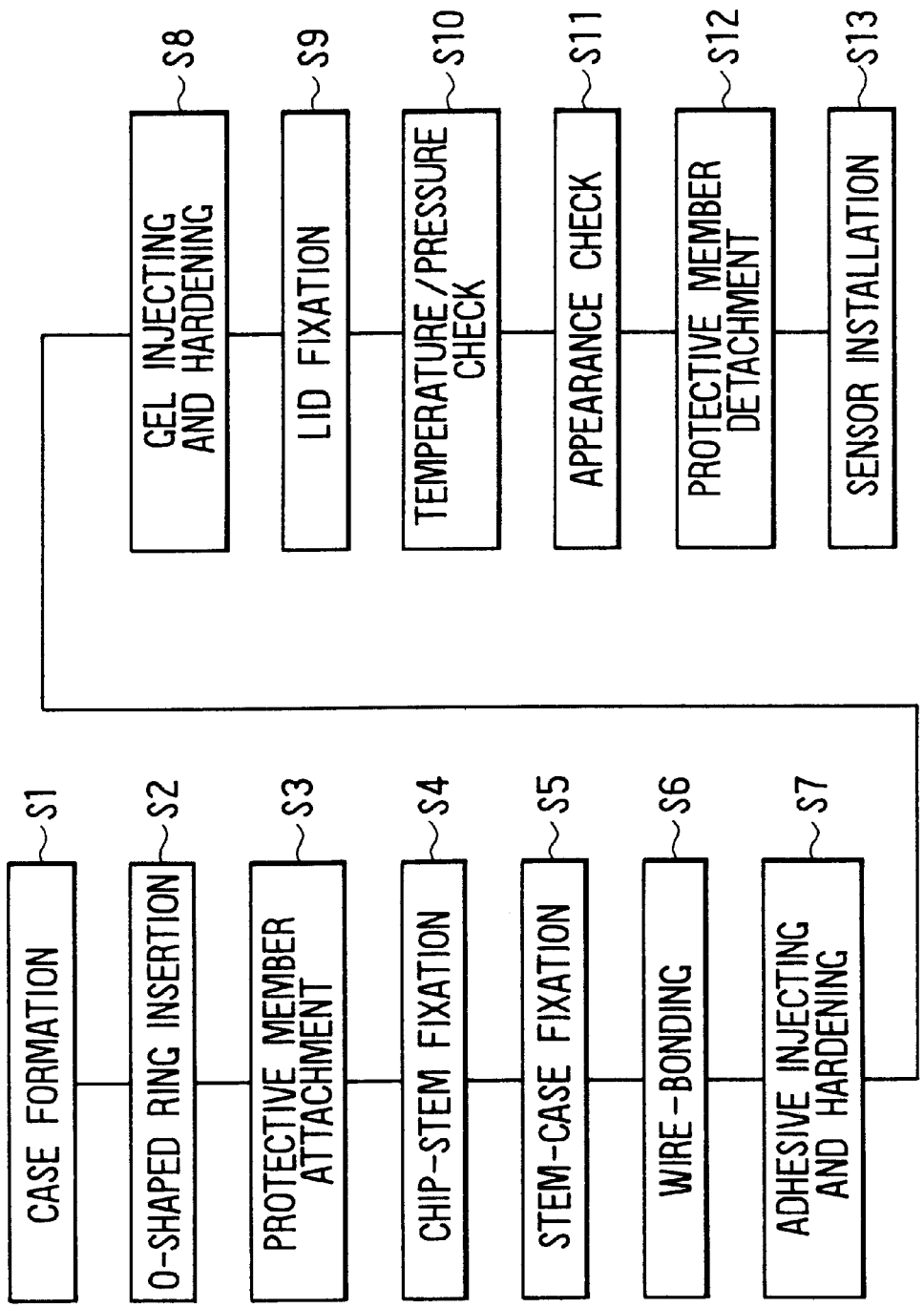

PRESSURE SENSOR AND METHOD FOR ASSEMBLING THE SAME

CROSS REFERENCE TO RELATED APPLICATIONS

This application is based upon and claims the benefit of Japanese Patent Applications No. 11-118563 filed on Apr. 26, 1999, and No. 2000-45143 filed on Feb. 17, 2000, the contents of which are incorporated herein by reference.

BACKGROUND OF THE INVENTION

1. Field of the Invention

This invention relates generally to a pressure sensor having a sensor element portion for detecting pressure and a pressure conduction portion for conducting pressure to the sensor element portion, and a method for assembling the same.

2. Description of the Related Art

FIG. 11 shows a conventional pressure sensor, which can be used as a fuel pressure sensor for detecting pressure in, for instance, a vehicle fuel tank (detected body). A silicon-made sensor chip J1 is bonded to a glass-made base J2 to form a sensor element portion J3 for detecting pressure. The sensor element portion J3 is fixedly accommodated in a recess of a housing J4 molded with polybutylene terephthalate (PBT) or the like.

The housing J4 is formed with a pressure conduction portion J6 defining a conduction passage J5 therein for conducting pressure toward the sensor element portion J3. An O-shaped annular groove J7 is formed on the outer circumference surface of the pressure conduction portion J6, and O-shaped ring J8 is retained in the groove J7. The pressure conduction portion J6 is connectable, by insertion, to a member of the detected body such as a hose communicating with the fuel tank. The O-shaped ring J8 seals the connected portion.

Generally, in this kind of pressure sensor, after the sensor element portion J3 is attached to the housing J4 holding the O-shaped ring J8, sensor pressure characteristics and the like are checked. After that, the pressure sensor is assembled with a member (detected member), a pressure of which is to be detected, at the pressure conduction portion J6 through the O-shaped ring J8.

Thus, the pressure sensor is assembled with the detected member after several check steps are performed in the state in which the O-shaped ring J8 is attached to the pressure conduction portion J6. In this case, as shown in FIG. 11, a rubber-made cap J9 is attached to the pressure conduction portion J6 until immediately before the pressure sensor is connected to the detected member. The cap J9 covers the O-shaped ring fixation portion (sealed portion) to thereby prevent foreign matter from sticking to the O-shaped ring fixation portion during the manufacture process.

In the method for protecting the O-shaped ring fixation portion by the cap J9, however, the pressure characteristic check is performed after the cap J9 is attached to the pressure conduction portion J6. Therefore, the cap J9 must be detached for a while for the check in which a check jig is connected to the pressure conduction portion J6 so that check pressure is conducted into the sensor element portion J3 through the conduction passage J5.

The attachment and detachment of the cap J9 during the manufacture process increases time and deteriorates workability. In addition, foreign matter may stick to the fixation portion when the cap J9 is detached. The foreign matter sticking to the fixation portion causes leakage of pressure, sealing deficiency and the like when the pressure sensor is assembled with the detected member. These problems occur not only when the pressure conduction portion is sealed by the O-shaped ring but also when it is sealed by a packing member, screw fastening or the like.

SUMMARY OF THE INVENTION

The present invention has been made in view of the above problems. An object of the present invention is to prevent foreign matters from sticking to a sealed portion of a pressure sensor where the pressure sensor is sealed to a detected member, until immediately before the pressure sensor is attached to the detected member.

According to a first aspect of the present invention, a method for assembling a pressure sensor includes preparing a pressure sensor having a sensor element portion for detecting a pressure and a pressure conduction portion defining therein a conduction passage for conducting the pressure to the sensor element portion. The method further includes attaching a protection member having an opening portion to the pressure conduction portion so that the conduction passage communicates with an outside of the pressure sensor through the opening portion.

Accordingly, a sealed portion of the pressure conduction portion where the pressure conduction portion is to be sealed to a detected member is covered until immediately before the pressure sensor is connected to the detected member to detect the pressure. Foreign matter is prevented from sticking to the sealed portion until immediately before the pressure sensor is connected to the detected member.

Because the conduction passage communicates with the outside thereof through the opening portion of the protective member, a check pressure can be conducted toward the sensor element portion through the opening portion of the protective member and the conduction passage to check sensor characteristics of the sensor element portion in the state where the sealed portion is covered with the protective member.

According to a second aspect of the present invention, a pressure sensor includes a sensor element portion, a pressure conduction portion, and a protective member detachably attached to the pressure conduction portion to cover a sealed portion of the pressure conduction portion. The pressure conduction portion has an opening portion through which a conduction passage in the pressure conduction portion communicates with an outside thereof.

Accordingly, sensor characteristics can be checked without detaching the protective member from the pressure conduction portion. As a result, foreign matter is not stuck to the sealed portion during the check.

BRIEF DESCRIPTION OF THE DRAWINGS

Other objects and features of the present invention will become more readily apparent from a better understanding of the preferred embodiments described below with reference to the following drawings, in which;

FIG. 3 is a flowchart showing a method for assembling the pressure sensor in a stepwise manner;

DETAILED DESCRIPTION OF THE PREFERRED EMBODIMENT

A preferred embodiment of the present invention will be explained with reference to appended drawings.

Figure 1:
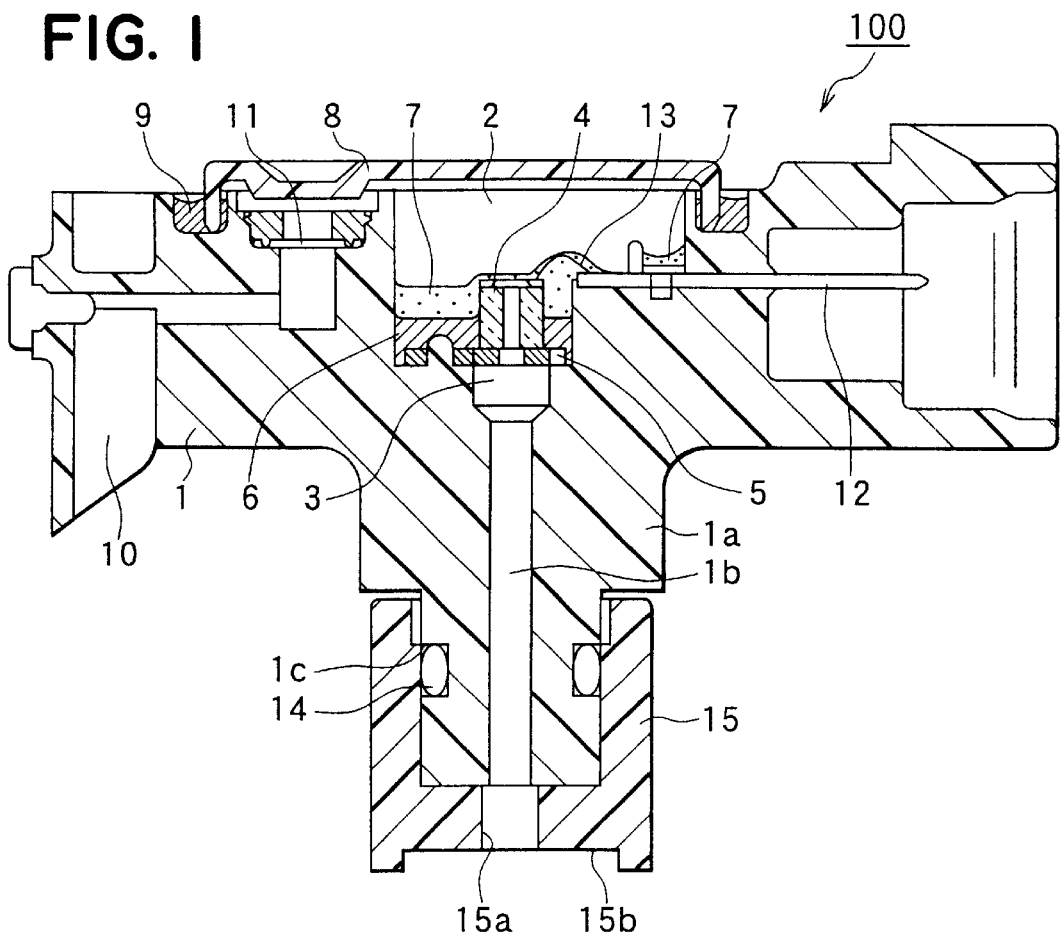
FIG. 1 is a cross-sectional view showing a pressure sensor in a preferred embodiment of the present invention.

Referring to FIG. 1, a pressure sensor 100 has a housing 1, which is made of resin such as PBT or polyphenylene sulfide (PPS) by molding. A recess portion is provided at the central portion of the housing (pressure conduction member) 1, and defines a space therein, which is partitioned by a sensor element portion 4 into a reference pressure chamber 2 and a measurement pressure chamber 3. Atmospheric pressure is conducted into the reference pressure chamber 2, while measurement pressure of, for instance, gasoline vapor is conducted into the measurement pressure chamber 3.

The housing 1 has an integral columnar pressure conduction portion (fitting) 1a located opposite to the recess portion. A conduction passage 1b is defined in the pressure conduction portion 1a for conducting measurement pressure toward the sensor element portion 4. The measurement pressure chamber 3 communicates with the space outside of the housing 1 through the pressure conduction passage 1b.

An O-shaped ring groove 1c is provided on the outer wall of the pressure conduction portion 1a, and a rubber-made O-shaped ring (sealing member) 14 is accommodated in the groove 1c. The pressure conduction portion 1a is connectable to a detected member such as a fuel tank or a hose or pipe connected to the fuel tank, pressure of which is to be detected. The O-shaped ring 14 seals the connected portion to prevent pressure leakage.

A protective cap 15 having an opening portion 15a is press-fitly fixed to the outer circumference of the pressure conduction portion 1a by insertion to cover the sealed portion (the O-shaped ring portion 14 and the O-shaped groove 1c) of the pressure conduction portion 1a. The conduction passage 1b communicates with the outside through the opening portion 15a. The protective cap 15, which is explained below in more detail, is made of rubber or resin such as nylon or PBT, and is attached to the pressure conduction portion 1a until immediately before the pressure sensor 100 is connected to the detected member.

Figure 2:
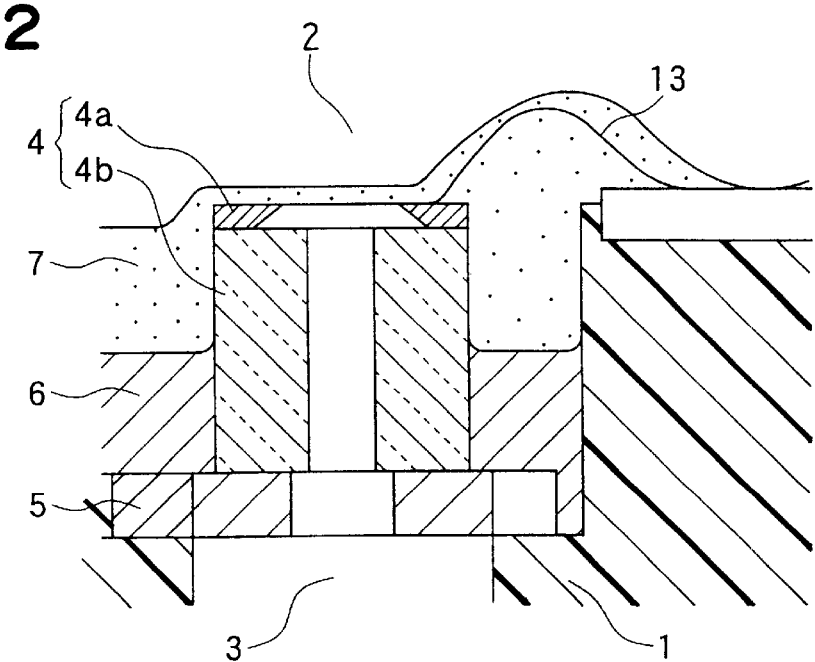
FIG. 2 is an enlarged cross-sectional view showing a sensor element portion of the pressure sensor.

As shown in FIG. 2, the sensor element portion 4 is composed of a pressure sensitive element 4a made of silicon or the like, a glass base 4b fixedly supporting the pressure sensitive element 4a. The pressure sensitive element 4a is composed of, for instance, a silicon substrate formed with a diaphragm, and bonded to the glass base 4b, a thermal extension coefficient of which is close to the silicon substrate. The glass base 4b has a through hole through which the pressure sensitive element 4a detects a difference in pressure between atmospheric pressure conducted into the reference pressure chamber 2 and measurement pressure conducted into the measurement pressure chamber 3.

The sensor element portion 4 is fixed to the housing 1 via a hollow stem 5 having a through hole. The stem 5 is made of 42-alloy (Fe:Ni=58:42), a thermal expansion coefficient of which is close to the glass base 4b, and the sensor element portion 4 is fixed to the stem 5 by adhesive such as thermosetting resin adhesive. The stem 5 is also fixed to the housing 1 by adhesive such as thermosetting resin adhesive. Accordingly, measurement pressure can be conducted to the back surface of the pressure sensitive element 4 from the measurement pressure chamber 3.

The recess portion of the housing 1 is filled with adhesive 6 such as thermosetting resin to enhance air-tightness at the fixation portions between the housing 1 and the stem 5, and between the stem 5 and the sensor element portion 4. Further, silicone gel 7 covers the adhesive 6 to improve moisture resistance of the sensor element portion 4.

Referring again to FIG. 1, an upper opening of the reference pressure chamber 2 is closed by a lid 8, which is made of resin such as PBT and is air-tightly fixed by adhesive 9. The reference pressure chamber 2 communicates with atmosphere through an atmospheric pressure conduction inlet 10 provided in the housing 1. A water-repellent filter 11 made of resin is fixed to the housing 11 at an inner part of the atmospheric pressure conduction inlet 10 by ultrasonic welding. The water-repellent filter 11 inhibits dust and water from entering the reference pressure chamber 2 while allowing air flowing.

An output terminal of the pressure sensitive element 4a, which is fixed to the housing 1 via the stem 5, is electrically connected to a terminal 12 via a bonding wire 13. Accordingly, a signal detected by the pressure sensitive element 4a can be outputted to an external part (for instance, an ECU of a vehicle).

In the pressure sensor 100 described above, after the protective cap 15 is detached, the pressure conduction portion 1a is connected to the detected member through the O-shaped ring 14 for sealing. Accordingly, measurement pressure of the detected member (fuel tank) is conducted into the measurement pressure chamber 3 from the conduction passage 1b, and is transmitted to the back surface of the pressure sensitive element 4a through the hollow portion of the stem 5 and the through hole of the glass base 4b. The measurement pressure transmitted to the pressure sensitive element 4a is, as described above, detected by the pressure sensitive element 4 as a difference in pressure from atmospheric pressure, and is outputted to the outside via the bonding wire 13 and the terminal 12.

Next, a method for manufacturing and assembling the pressure sensor 100, and for connecting the pressure sensor 100 to the detected member will be explained specifically with reference to FIG. 3. First, at case formation step S1, the housing 1 is molded with resin such as PBT or PPS. At that time, the terminal 12 is insert-molded in the housing 1. The water-repellent filter 11 is then fixed to the housing 1 by ultrasonic welding or the like.

Figure 4A:
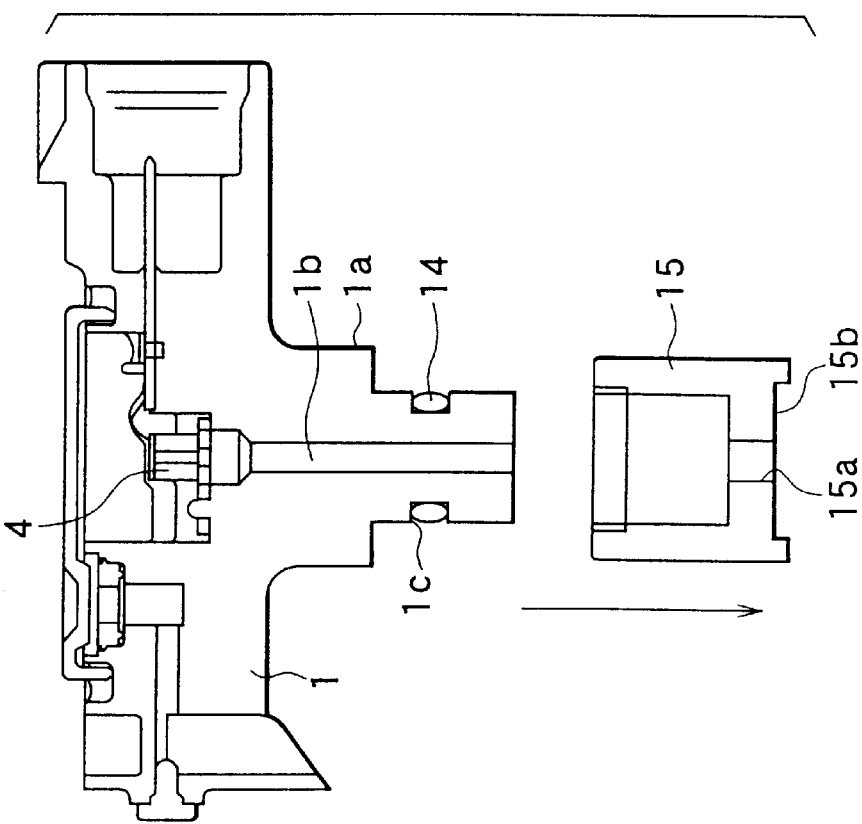
FIGS. 4A and 4B are explanatory views for explaining attachment and detachment of a protective cap.

Next, at O-shaped ring insertion step (O-shaped ring attachment step) S2, the O-shaped ring 14 is fitted in the O-shaped ring groove 1c on the pressure conduction portion 1a. At protective member insertion step (protective member attachment step) S3, the protective cap 15 is attached to the pressure conduction portion a1 to cover the O-shaped ring 14 and the groove 1c (sealed portion) with the opening portion 15a through which the conduction passage 1b communicates with the outside thereof. Specifically, as shown in FIG. 4A, the protective cap 5 is manually attached to the pressure conduction portion 1a by insertion to sightly press-fit the pressure conduction portion 1a. As a result, the protective cap 15 is fixed to the pressure conduction portion 1a. The housing 1 to which the protective cap 15 is attached flows in the manufacture process for manufacturing the pressure sensor.

Next, at chip-stem fixation step S4, the pressure sensitive element 4a is bonded to the glass base 4b, thereby forming the sensor element portion 4. The glass base 4b of the sensor element portion 4 is then bonded to the stem 5. At stem-case fixation step S5, the stem 5 to which the sensor element portion 4 is fixed is bonded to the recess portion of the housing 1. Accordingly, the reference pressure chamber 2 and the measurement pressure chamber 3 are partitioned from each other in the recess portion of the housing 1. The steps S4 and S5 correspond to an element portion fixation step.

Then, at wire-bonding step S6, the output terminal of the pressure sensitive element 4a is wire-bonded to the terminal 12 through the bonding wire 13. At adhesive injecting and hardening step S7, the adhesive 6 is injected into the recess portion at the side of the reference pressure chamber 2, and is hardened by a heat treatment or the like. At a gel injecting and hardening step S8, the silicone gel 7 is injected to cover the sensor element portion 4 and the wire-bonding portion, and is hardened. At lid fixation step S9, the lid 8 is fixed to the housing 1 by the adhesive 9 to close and air-tightly seal the upper opening portion of the reference pressure chamber 2. As a result, the pressure sensor 100 shown in FIG. 1 is completed.

Figure 5:
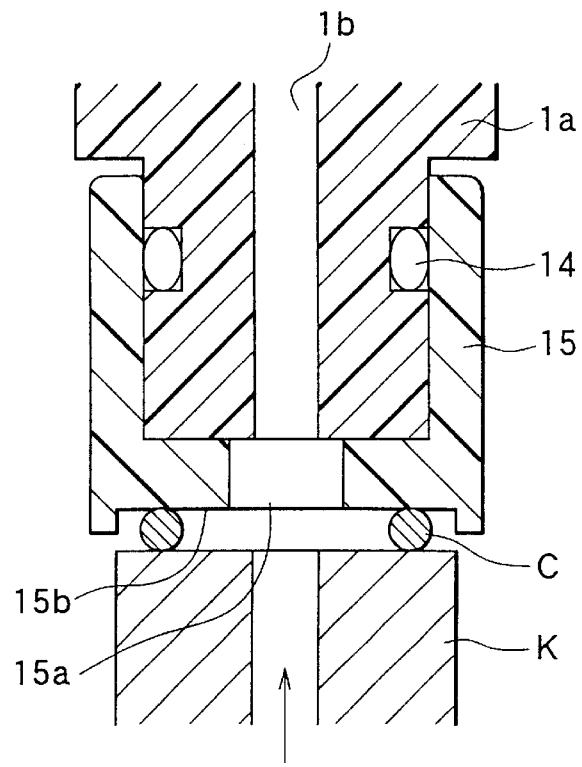
FIG. 5 is a cross-sectional view showing a connecting constitution of a check jig to the pressure sensor in FIG. 1.

After that, at temperature/pressure check step (characteristics check step) S10, the characteristics of the sensor 100, i.e., whether the sensor 100 works appropriately or not, is checked. Specifically, as shown in FIG. 5, the protective cap 15 and a check jig K are connected to each other through a sealing member C for check interposed therebetween. Check pressure is conducted toward the sensor element portion 4 through the opening portion 15a of the protective cap 15 and the conduction passage 1b. Thus, it is checked whether an appropriate output (detection signal) is outputted from the sensor element portion 4 in accordance with temperature.

At this step, the check jig K and the pressure conduction portion 1a are sealed with each other at the sealing face 15b of the protective cap 15. The sealing face 15b is flattened to have a surface roughness of, for instance, approximately larger than 6.3 Z. Accordingly, the sealing face 15b provides sufficient air tightness between the pressure conduction portion 1a and the check jig K, and makes it possible to perform the check step securely without causing leakage of measurement pressure. Next, at appearance check step S11, appearance check of, for instance, whether the pressure sensor 100 has damages in appearance or not, is performed to the pressure sensor 100.

Figure 4B:
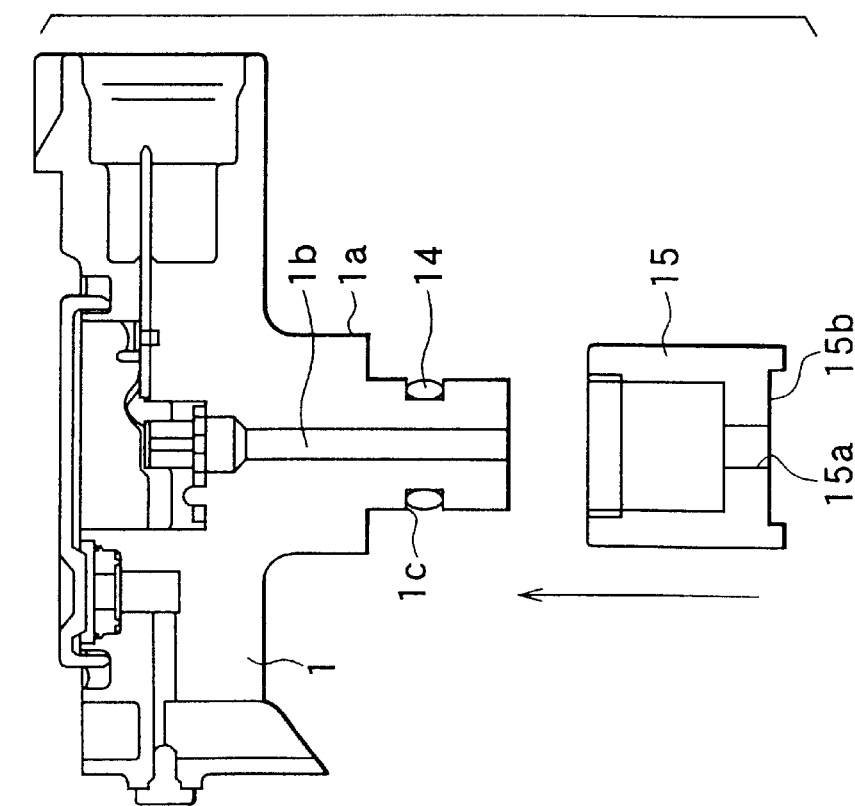

Then, immediately before the pressure sensor 100 is connected to the detected member (fuel tank, hose, or the like), protective member detachment step S12 is performed. At the step S12, as shown in FIG. 4B, the protective cap 15 is manually detached from the pressure conduction portion 1a of the housing 1.

Next, at sensor installation step (connection step) S13, the pressure sensor 100 from which the protective cap 15 is detached is connected to the detected member. Specifically, the pressure conduction portion 1a of the housing 1 is inserted into a pipe member (not shown) to be sealed via the O-shaped ring 14. The pressure sensor 100 thus assembled (installed) to the detected member is operable as a sensor.

According to the assembling method described above, the sealed portion (O-shaped ring 14 and the O-shaped groove 1c) of the pressure conduction portion 1a is covered with the protective cap 15 for protection until immediately before the sensor installation step S13 is performed. Therefore, foreign matter is effectively prevented from sticking to the sealed portion after the step S3 is performed until when the step S12 is performed. Consequently, the pressure sensor 100 can be fixed to the detected member in a sufficiently airtight manner.

When the protective cap 15 is attached to the pressure conduction portion 1a, the opening portion 15a of the protective cap 15 allows measurement pressure to enter the conduction passage 1b. Because of this, the sensor characteristics (pressure characteristics) can be checked in the state in which the sealed portion is protected by the protective cap 15. Further, because the protective cap 15 is slightly press-fitly attached to the pressure conduction portion 1a, the protective cap 15 is difficult to be detached at the following steps. Therefore, the sealed portion can be protected appropriately during the steps.

Figure 6:
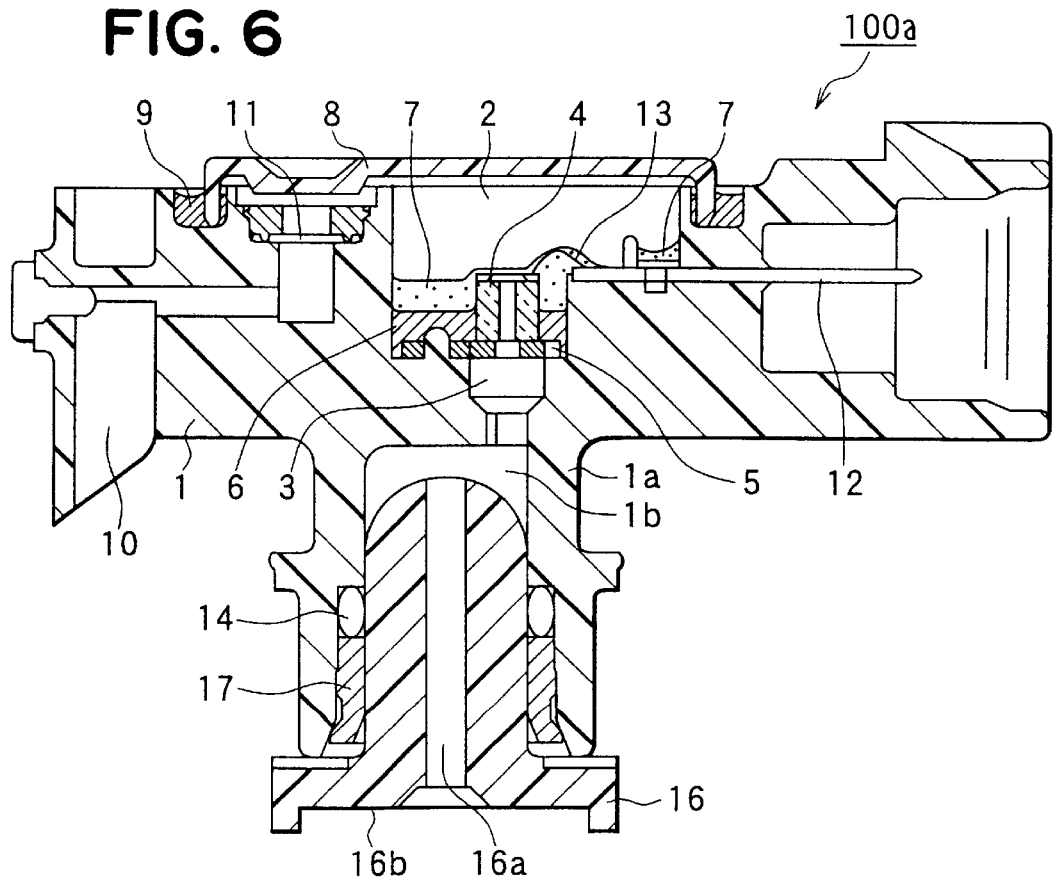
FIG. 6 is a cross-sectional view showing a pressure sensor having an insertion member as a protective member as modification.

The protective cap 15 is shaped to correspond to the contour of the pressure conduction portion 1a. However, the protective member is not limited to such a protective cap, but may be modified as shown in FIG. 6. In a pressure sensor 100a shown in FIG. 6, the O-shaped ring 14 is attached to the inner wall defining the conduction passage 1b, and an insertion member 16 is used as the protective member. In this case, a spacer 17 is provided in the conduction passage 1b to prevent the detachment of the O-shaped ring 14 from the conduction passage 1b.

The insertion member 16 is made of the same material as that of the protective cap 15, and has a contour capable of being slightly press-fitly inserted into the conduction passage 1b. Further, the insertion member 16 has a through hole 16a through which the conduction passage 1b communicates with the outside thereof. A surface 16b functions as a sealing face similarly to the sealing face 14b. The thus constructed insertion member 16 is attached to the pressure conduction portion 1a so that the O-shaped ring 14 intervenes between the insertion member 16 and the inner wall of the conduction passage 1b.

Figure 7A:
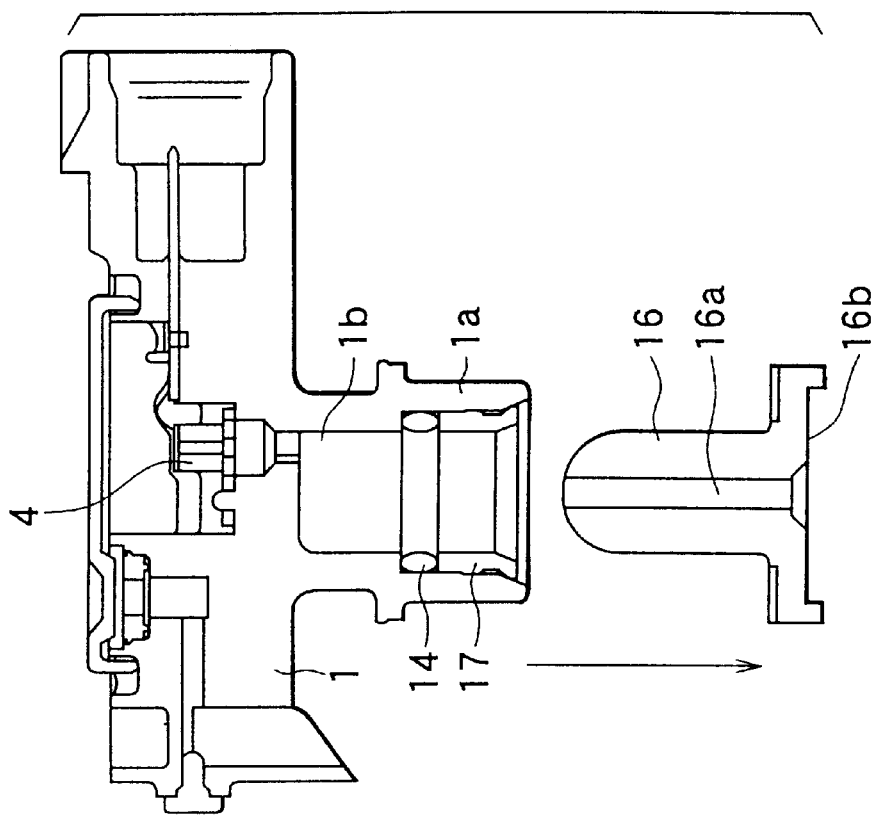
FIGS. 7A and 7B are explanatory views for explaining attachment and detachment of the insertion member in FIG. 6.
Figure 7B:
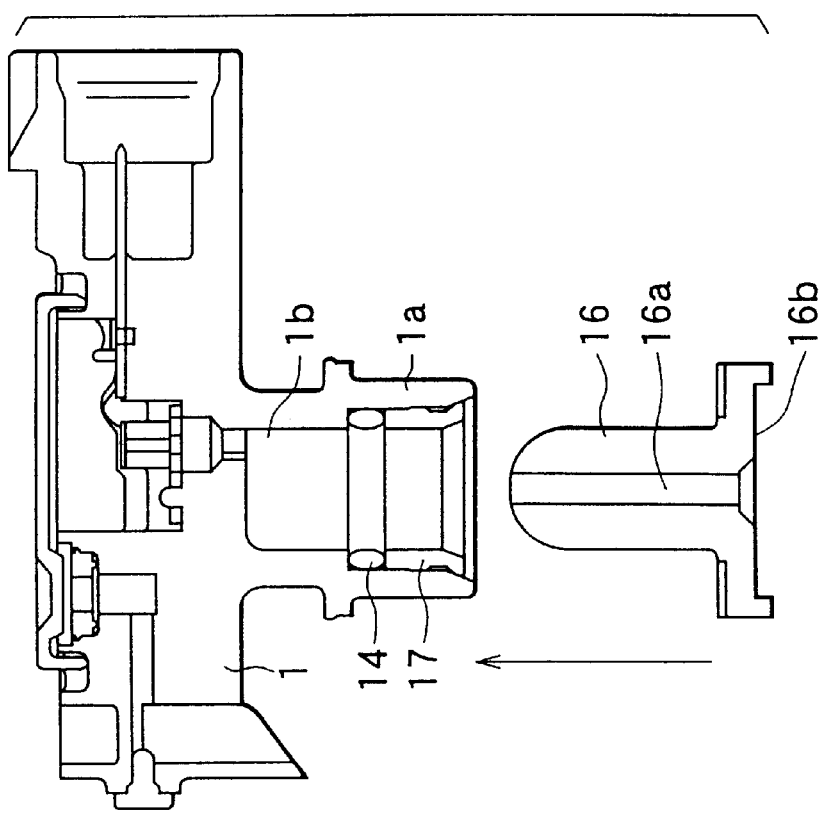

In this case, at the protective member insertion step S3, as shown in FIG. 7, the insertion member 16 is manually and slightly press-fitly inserted into the conduction passage 1b. Further, at the protection member detachment step S12, as shown in FIG. 7B, the insertion member 16 is manually detached from the pressure conduction portion 1a. Accordingly, the O-shaped ring 14 disposed on the inner wall of the conduction passage 1b is covered with the insertion member 16 for protection. As a result, the same effects as those in the case using the protective cap 15 can be provided.

That is, because the sensor characteristics can be checked without detaching the protective member 16 from the pressure conduction portion 1a, the protective member 16 can cover the sealing member (O-shaped ring 14) until immediately before the pressure sensor 100a is attached to the detected member, thereby preventing foreign matters from sticking to the O-shaped ring 14.

Figure 8:
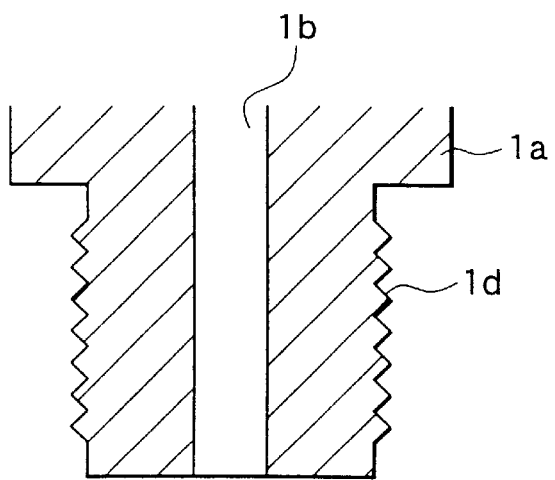
FIG. 8 is a thread portion formed at an outer wall of a pressure conduction portion as a sealing member.

In the embodiment described above, the sealing member composed of the O-shaped ring 14 is provided to seal the pressure conduction portion 1a with respect to the detected member. However, other separate members such as a resin-made packing member may constitute the sealing member to seal the pressure conduction portion 1a. Further, the sealing member may be integrated with the pressure conduction portion 1a. For instance, as shown in FIG. 8, a thread portion 1d may be provided at an outer wall of the pressure conduction portion 1a as such an integrated sealing member to be screwed to the detected member. When the pressure conduction portion is press-fitly inserted into the detected member, the outer wall of the pressure conduction portion functions as the sealing member.

Figure 9:
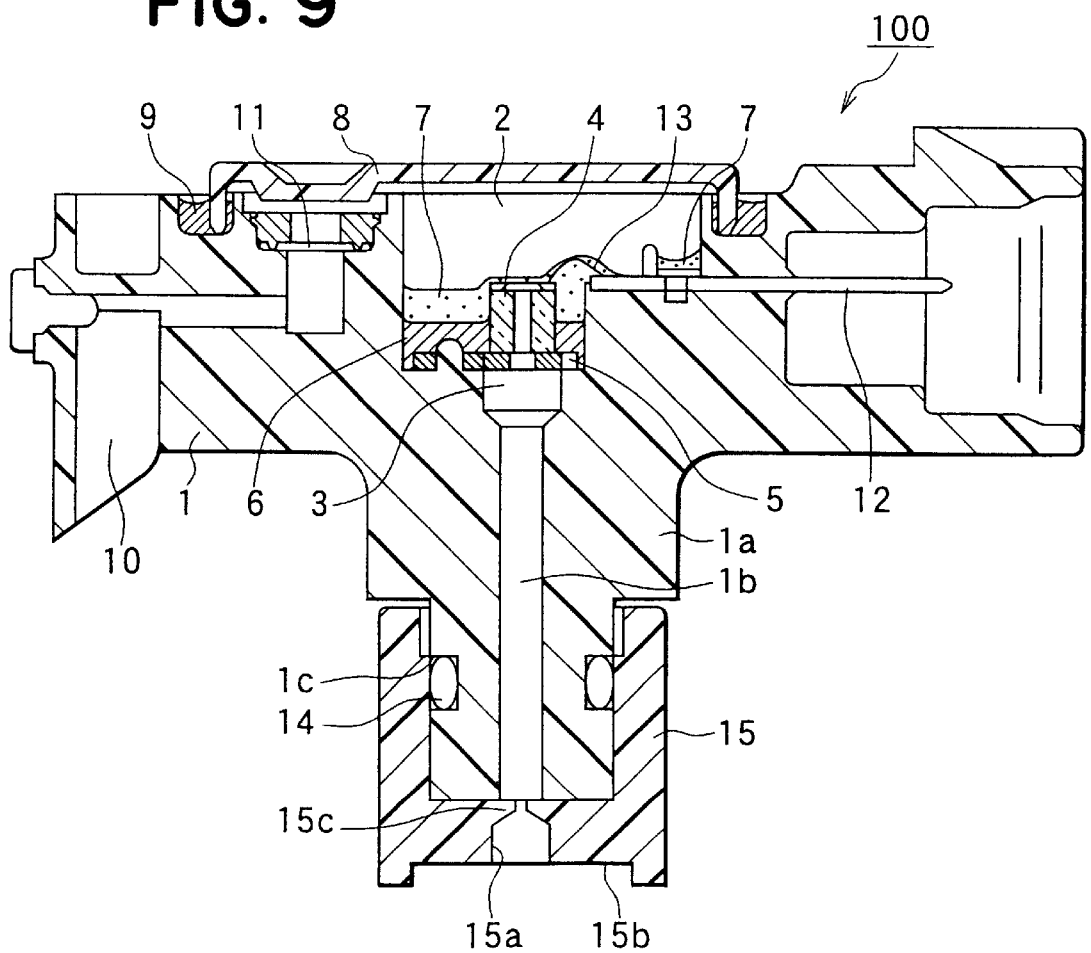
FIG. 9 is a cross-sectional view showing the pressure sensor in FIG. 1 to which a foreign matter preventive portion is provided.

Also, as shown in FIG. 9, the protective member 15 shown in FIG. 1 may have a foreign matter preventive portion 15c in the opening portion 15a at a side communicating with the conduction passage 1b. The foreign matter preventive portion 15c has an opening area (passage area) smaller than that of the opening portion 15a at an outwardly open side, thereby preventing foreign matter from passing therethrough.

Figure 10:
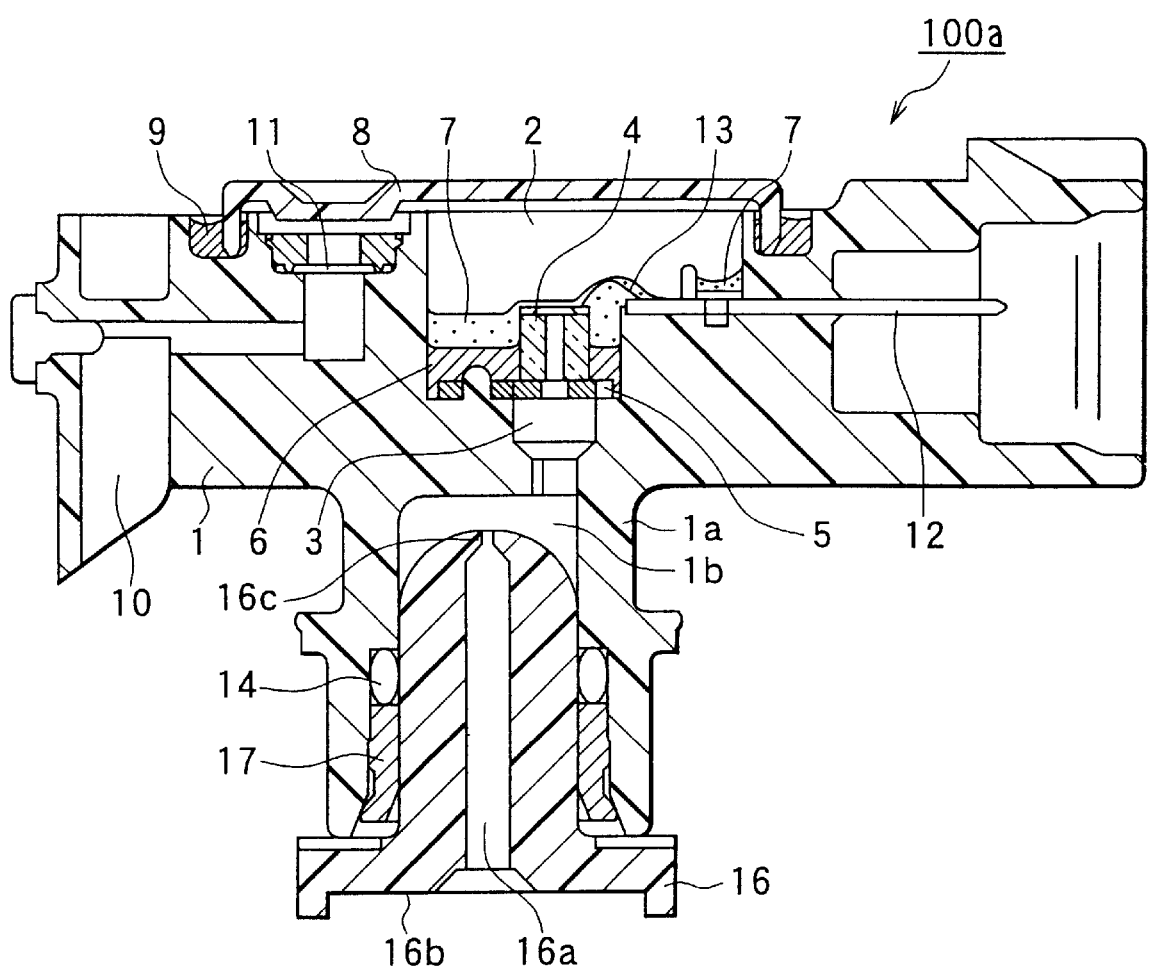
FIG. 10 is across-sectional view showing the pressure sensor in FIG. 6 to which a foreign matter preventive portion is provided.
Figure 11:
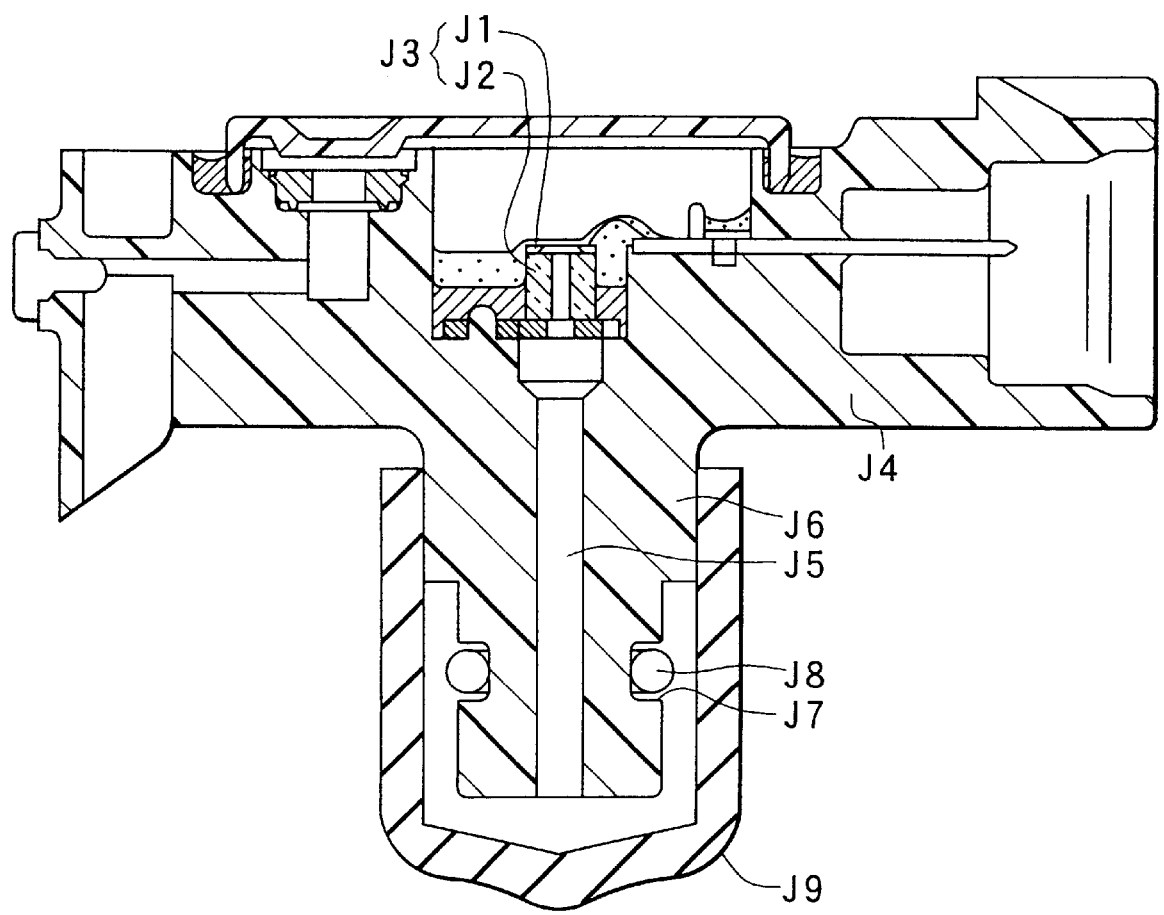
FIG. 11 is a cross-sectional view showing a pressure sensor according to a prior art.

Likewise, as shown in FIG. 10, the protective member 16 shown in FIG. 1 may have a foreign matter preventive portion 16c in the through hole (opening portion) 16a at a side communicating with the conduction passage 1b. The foreign matter preventive portion 16c has a passage area (opening area) smaller than that of the through hole 16a at an outwardly open side, thereby preventing foreign matter from passing therethrough.

The protective members 15, 16 shown in FIGS. 9 and 10 can prevent foreign matters from invading into the pressure conduction portion 1a while preventing foreign matters from sticking to the sealed portion of the pressure conduction portion 1a until immediately before the pressure sensor is connected to the detected member. Consequently, the pressure sensors can be manufactured with high reliability.

The present invention is directed to the protective member, and therefore, it would be apparent that the other portions can be modified appropriately. The present invention is not limited to the fuel pressure sensor described above, but may be applied to other pressure sensors such as an injection pressure sensor and an intake pressure sensor for a vehicle engine and a pressure sensor for detecting a pressure in a pipe used for transportation of gas or liquid. The present invention can be applied to a sensor which has a sensor element portion for detecting pressure, and a pressure conduction portion, which has a conduction passage for conducting pressure toward the sensor element portion and can be air-tightly fixed to a detected member.

The protective members 15, 16 may be attached or detached not manually but automatically using a device (not shown). The protective members 15, 16 may be made of material capable of providing the sealing effect described above, such as metal, silicon, or glass, in addition to resin such as PBT.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method of assembling and testing a sensor within a pressure sensor device comprising:

attaching a removable protective member to a fitting that couples an inlet of a conduction passage of the sensor to the pressure sensor device and conducts a fluid to the sensor within the pressure sensor device for protecting the fitting;

removing the removable protective member from the fitting immediately before the sensor is installed in the pressure sensor device;

testing the sensor by connecting a test apparatus to the removable protective member such that a passage of the test apparatus is connected with the conduction passage; and removing the test apparatus from the removable protective member when the testing is completed.

2. The method of claim 1, further comprising:

removing the removable protective element from the fitting; and installing the sensor in the pressure sensor device by engaging the fitting with the pressure sensor device.

3. The method of claim 1, further including placing a hermetic seal member between the removable protective member and the test apparatus when testing the pressure sensor device.

4. The method of claim 3, further comprising:

removing the removable protective element from the fitting; and installing the sensor in the device by engaging the fitting with the pressure sensor device.

5. A pressure sensor for sensing a pressure in a device, the pressure sensor comprising:

a sensitive element that reacts to pressure changes;

a fitting, which includes a conduction passage for transmitting pressure from a device to the sensitive element, wherein the fitting is fitted to the device when the pressure sensor is installed in the device;

a removable protective member attached to the fitting for protecting the fitting, wherein the removable protective member includes a test passage for connecting the conduction passage with a test apparatus and for permitting fluid to flow through the removable protective member for testing the pressure sensor before the sensor is installed in the device, wherein the removable protective member is removed from the fitting before the sensitive element is installed in the device so that the fitting is directly attached to the device without interference by the removable protective member.

6. The pressure sensor according to claim 5, wherein the fitting includes a flexible seal member for providing an air-tight seal about the conduction passage when the sensor is installed in the device.

7. The pressure sensor according to claim 6, wherein the seal element engages the removable protective member when the removable protective member is attached to the fitting and wherein the seal element engages the device when the sensitive element is attached to the device.

8. The pressure sensor of claim 5, wherein the fitting includes a seal element for sealing the fitting when the fitting is installed in the device and for engaging the removable protective member when the removable protective member is attached to the sensor.

9. The pressure sensor of claim 5, wherein the test passage has a first opening and a second opening, and one of the first and the second openings is smaller than the other to restrict foreign matter from passing through the protective cover.

10. The pressure sensor of claim 5, wherein the fitting comprises:

a groove in the fitting; and a seal fitted in the groove.

11. The pressure sensor of claim 10, wherein the seal is a flexible seal element.

12. The pressure sensor of claim 10, wherein the groove is on an outer surface of the fitting.

13. The pressure sensor of claim 5, wherein the removable protective member is attached to the fitting by being inserted within the fitting.

14. The pressure sensor of claim 5, wherein the removable protective member is attached to the fitting by being slid over an outer portion of the fitting.

15. The pressure sensor of claim 5, wherein the test passage of the removable protective member has a first opening for communicating with a check jig and a second opening for communicating with the sensitive element, and a width of the second opening is smaller than a width of the first outer opening for restricting foreign matter from passing through the second opening.

16. The pressure sensor of claim 1, wherein the testing of the sensor further comprises testing the sensor by connecting a test apparatus to the removable protective member such that a passage of the test apparatus including a first opening proximally located relative to a sealing face of the removable protective member, and a second opening distally located relative to the sealing face of the removable protective member and being smaller than the first opening to restrict foreign matter from passing through the removable protective member, is connected with the conduction passage.

17. The pressure sensor of claim 9, wherein the attaching a removable protective member to a fitting comprises press fitting the removable protective member to the fitting, and the removing the removable protective member from the fitting comprises disengaging the press fit removable protective member from the fitting.

18. The pressure sensor of claim 9, wherein the first opening is proximally located relative to a sealing face of the removable protective member, and the second opening is distally located relative to the sealing face of the removable protective member, the second opening being smaller than the first opening to restrict foreign matter from passing through the removable protective member.

19. The pressure sensor of claim 1, wherein the removable protective member includes an inner surface for engaging the fitting in a press-fit manner to enable the removable protective member to be engaged and disengaged with the fitting.

* * * * *